US008184415B2

(12) United States Patent
Savin et al.

(10) Patent No.: US 8,184,415 B2
(45) Date of Patent: May 22, 2012

(54) ESD-PROTECTION DEVICE, A SEMICONDUCTOR DEVICE AND INTEGRATED SYSTEM IN A PACKAGE COMPRISING SUCH A DEVICE

(75) Inventors: Emmanuel Savin, Soulangy (FR); Stephane Bouvier, Cairon (FR)

(73) Assignee: NXP B.V., Eindhoven (NL)

( * ) Notice: Subject to any disclaimer, the term of this patent is extended or adjusted under 35 U.S.C. 154(b) by 292 days.

(21) Appl. No.: 12/525,179

(22) PCT Filed: Feb. 8, 2008

(86) PCT No.: PCT/IB2008/050464
§ 371 (c)(1),
(2), (4) Date: Nov. 30, 2009

(87) PCT Pub. No.: WO2008/099317
PCT Pub. Date: Aug. 21, 2008

(65) Prior Publication Data
US 2010/0085672 A1     Apr. 8, 2010

(30) Foreign Application Priority Data

Feb. 12, 2007   (EP) ..................................... 07290175

(51) Int. Cl.
*H02H 3/22* (2006.01)
(52) U.S. Cl. .......................................... 361/56; 361/111
(58) Field of Classification Search ................ 361/56, 361/111; 257/355–360
See application file for complete search history.

(56) References Cited

U.S. PATENT DOCUMENTS

| 4,213,140 | A | * | 7/1980 | Okabe et al. | .................. 257/357 |
| 5,661,322 | A | * | 8/1997 | Williams et al. | .............. 257/331 |
| 6,501,632 | B1 | * | 12/2002 | Avery et al. | .................... 361/111 |
| 2001/0010379 | A1 | * | 8/2001 | Yoshida et al. | ............... 257/355 |
| 2007/0145411 | A1 | * | 6/2007 | Chen et al. | ..................... 257/173 |

FOREIGN PATENT DOCUMENTS

| EP | 0928054 A | 7/1999 |
| GB | 2092379 A | 8/1982 |
| WO | 2005117133 A | 12/2005 |

OTHER PUBLICATIONS

Philips; Product Sheet—PESDxL2BT Series (Rev. 01-1 Nov. 2005).

* cited by examiner

*Primary Examiner* — Danny Nguyen

(57) ABSTRACT

The invention relates to an ESD protection device comprising: a first contact (10) and a second contact (20), and an electrical node (12); a bipolar transistor (6) having a base, an emitter, and a collector, the base and emitter forming a base-emitter junction, the base and collector forming a base-collector junction, the emitter being connected to the first contact (10), the collector being connected to the second contact (20), the base being connect to the electrical node (12); a first diode (1) connected between the electrical node (12) and the first contact (10), the first diode (1) comprising a first junction arranged in the same direction as the base-emitter junction, and—a second diode (2) connected between the electrical node (12) and the second contact (20), in anti-series with the first diode (1) on a path from the first contact (10) to the second contact (20), the second diode (2) comprising a second junction arranged in the same direction as the base-collector junction, wherein the bipolar transistor (6) is dimensioned to have such a current gain ($\beta$) that the voltage-current characteristic of the ESD protection device, measured between the first (10) and second contact (20), exhibits a voltage snap-back effect (SNP) at its trigger voltage (Vtrig). The voltage snap-back effect (SNP) results in a lower clamping voltage of the ESD protection device. The invention further relates a semiconductor device and an integrated system in a package comprising said ESD protection device.

20 Claims, 7 Drawing Sheets

ESD-PROTECTION DEVICE, A SEMICONDUCTOR DEVICE AND INTEGRATED SYSTEM IN A PACKAGE COMPRISING SUCH A DEVICE

FIELD OF THE INVENTION

The invention relates to an ESD protection device, a semiconductor device and an integrated system in a package comprising such a device.

BACKGROUND OF THE INVENTION

ESD protection devices of the kind mentioned in the opening paragraph are known, for example from a Philips product data sheet of the PESDxL2BT series (Rev. 01—1 Nov. 2005), "*Low capacitance double bidirectional ESD protection diodes in SOT23*". This datasheet discloses a low capacitance double bidirectional Electrostatic Discharge (ESD) protection diodes in a SOT23 small Surface Mounted Device (SMD) plastic package designed to protect two signal lines from the damage caused by ESD and other transients. The package comprises three pins ("cathode 1", "cathode 2", "double cathode 3"). Between pins "cathode 1" and "double cathode 3" there is a first anti-series connection of two Zener-diodes, and between pins "cathode 2" and "double cathode 3" there is a second anti-series connection of two Zener-diodes. The data sheet also discloses (in FIG. 8 of the data sheet) the voltage-current characteristic of the ESD protection diodes. The voltage-current characteristic clearly shows a sharp current increase after that the breakdown voltage (VBR) has been reached. The data sheet discloses (see table 8 of the data sheet) different ESD protection device types having a breakdown voltage (max value) between 6.9V and 30.3V. The corresponding clamping voltages are lying between 8V and 70V depending on the ESD structure type.

A disadvantage of the known ESD protection devices is that the clamping voltage is still relatively high.

SUMMARY OF THE INVENTION

It is an object of the invention to provide an ESD protection device having a reduced clamping voltage.

The invention is defined by the independent claims. The dependent claims define advantageous embodiments.

In a first aspect the object of the invention is achieved by providing an ESD protection device comprising:
  a first contact and a second contact, and an electrical node;
  a bipolar transistor having a base, an emitter, and a collector, the base and emitter forming a base-emitter junction, the base and collector forming a base-collector junction, the emitter being connected to the first contact, the collector being connected to the second contact, the base being connect to the electrical node;
  a first diode connected between the electrical node and the first contact, the first diode comprising a first junction arranged in the same direction as the base-emitter junction, and
  a second diode connected between the electrical node and the second contact, in anti-series with the first diode on a path from the first contact to the second contact, the second diode comprising a second junction arranged in the same direction as the base-collector junction, wherein the bipolar transistor is dimensioned to have such a current gain β that the voltage-current characteristic of the ESD protection device, measured between the first and second contact, exhibits a voltage snap-back effect at its trigger voltage.

With the addition of a bipolar transistor a very interesting operation of the device is achieved. When used for protecting an electronic device for ESD events, the ESD protection device is connected with its first contact and its second contact, to the nodes of the device under protection. During normal operation of the device under protection, the voltage between the first contact and the second contact is under a trigger voltage of the diode anti-series connection. This results in a high impedance of the ESD device and the ESD device does not disturb the operation of the device under protection. Still an extremely small leakage current will run through the diodes to supply a base current for the bipolar transistor. During an ESD event, the voltage between the first and second contact increases above a trigger level of the diodes anti-series connection and the leakage current rapidly increases. The bipolar transistor is designed with such a current gain that as soon as the leakage current increases above a trigger level the bipolar transistor switches on and its impedance decreases rapidly. As a result, most of the ESD current will run through the bipolar transistor. The impedance of the bipolar transistor decreases so rapidly, that the voltage reduces to a level even below the trigger level and will hardly increase even if the ESD current increases even further. As a result, the clamping voltage is very low due this effect, which is now also being referred to as the "voltage snapback effect".

In a preferred embodiment of ESD protection device according to the invention the first diode and the second diode are Zener-diodes. Zener-diodes are used to clamp in their reverse-direction which advantageously provides clamping at a larger voltage than normal diodes which are normally used to clamp in their forward direction. The use of a Zener anti-series connection thus enables ESD protection of nodes having a larger voltage swing.

In a further embodiment of the ESD protection device according to the invention the first junction, the second junction, the base-emitter junction, and the base-collector junction are formed by semiconductor regions of a first conductivity type in a semiconductor body of a second opposite conductivity type. This ESD protection device may advantageously be integrated with other semiconductor devices.

The ESD protection device according to the invention thus comprises a bipolar transistor, which may be added as an additional component. The advantage of such an embodiment is that the transistor and the diodes can be designed independently.

A very advantageous embodiment of the ESD protection device is obtained when the base-emitter junction is formed by the first junction and the base-collector junction is formed by the second junction, so as to use a parasitic bipolar transistor already present formed by the first junction and the second junction of the diodes. This embodiment does not need a separate bipolar transistor and is thus less complex and cheaper. Moreover, an additional advantage of this ESD protection device is that it is much easier to design, because the number of design parameters has reduced. Instead of dimensioning the diodes and the bipolar transistor separately, now only the bipolar transistor has to be designed.

In one variation on the advantageous embodiment of the ESD protection device according to the invention the gain of the bipolar transistor is determined by the distance between the first junction and the second junction. The shorter the distance the higher the current gain of the bipolar transistor. Additionally, in another variation the gain of the bipolar transistor is determined by doping levels of the semiconductor body. The lower the base doping, the higher the current gain. So, clearly the designer has multiple parameters which he may use, in any possible combination, to design the parasitic bipolar transistor such that in the voltage-current characteristic of the ESD protection device the voltage-snapback effect is achieved.

The robustness of an ESD protection device is determined by the maximum amount of current it may carry. The maximum current of a bipolar transistor is on its turn determined by the effective base area, wherein the effective base area is defined perpendicular to the current-flow direction of the collector-emitter current. The larger the effective base area, the larger the maximum allowable current. If the ESD protection device is implemented as semiconductor regions of a first conductivity type in a semiconductor substrate of a second opposite conductivity type, the base area is indirectly determined by the dimensions of the semiconductor regions of the first conductivity type, especially those dimensions perpendicular to the current-flow direction of the collector-emitter current, being the depth of the semiconductor regions of the first conductivity type and the width of the semiconductor regions perpendicular to the current-flow direction. The larger these dimensions, the larger the maximum allowable current.

In preferred embodiments of the ESD protection device according to the invention the first junction is formed as a first trench diode, and preferably the second junction is formed as a second trench diode. Implementing the junctions as trench diodes enables the designer to make very large junction areas at a fixed lateral dimension and thus the same packing density of the semiconductor device. Moreover, provided that the trench depths are much larger than the trench widths, the junction area has become almost linear to the trench depth, while the trench depth is generally a quantity (and thus also a parameter) which is easy to control in a manufacturing process.

In one group of embodiments of the ESD protection device according to the invention the trench diodes comprise a first region of a first conductivity type at a sidewall of the trench and a second region of a second opposite conductivity type adjacent to the first region away from the trench. This type of trench diodes can be easily made using conventional process techniques.

In a further improvement of last mentioned group of embodiments of the ESD protection device the trench of the first trench diode comprises a dielectric layer provided on all sidewalls of the trench and a conductive layer provided on the dielectric layer for forming a capacitor between the conductive layer and the first region of the first trench diode. The capacitor thus formed may advantageously be used in certain applications. In some process technologies, for example the Passive Integration Connection Substrate (PICS) process as used within NXP semiconductors, the capacitor is formed without any additional process steps. The PICS process is in the first place a process for integrating capacitors, however while manufacturing these capacitors diodes and transistors can be obtained almost for free. This makes the PICS process a very attractive process for implementing the ESD protection device according to the invention. An ESD protection device comprising a large capacitor is especially suitable for low-frequency applications. At low frequencies the impedance of the capacitor is very large thus the ESD protection then hardly influences the device under protection.

In a further embodiment of the ESD protection device the conductive layer of the capacitor is electrically connected to the first region of the second trench diode so as to be connected in parallel to the bipolar transistor. The advantage of this embodiment is that the capacitor may now be used for decoupling the ESD pulse on one of the first and second contacts of the bipolar transistor, which very effectively reduces the maximum ESD voltage peak, which is generally the first and the fastest current peak (see FIG. 1).

In yet a further embodiment of the ESD protection device the trench of the second trench diode comprises a further dielectric layer provided on all sidewalls of the trench and a further conductive layer provided on the further dielectric layer for forming a further capacitor between the further conductive layer and the first region of the second trench diode. The further capacitor may also advantageously be used in certain applications.

In a variation on last mentioned embodiment the further conductive layer of the further capacitor is electrically connected to the first region of the first trench diode so as to be connected in parallel to the bipolar transistor. By doing so, an effective capacitor, which is connected in parallel with the bipolar transistor, having a higher capacitance is achieved which results in better decoupling of the ESD voltage peak.

In an alternative embodiment to last mentioned embodiment the trench of the second trench diode comprises a further dielectric layer provided on all sidewalls of the trench and a further conductive layer provided on the further dielectric layer for forming a further capacitor between the further conductive layer and the first region of the second trench diode, the capacitor and the further capacitor being connected in series with each other and in parallel with the bipolar transistor. In this embodiment the effective capacitor, which is connected in parallel with the bipolar transistor, is reduced. However, the advantage is that the breakdown voltage of the effective capacitor is increased.

In a further group of embodiments the first trench diode and the second trench diode are formed by a trench filled with material of a first conductivity type, and material adjacent the trench of a second opposite conductivity type. This group of embodiments provides an ESD structure having a less complex structure than the group of embodiments wherein a capacitor is present in the trench.

Advantageous embodiments are obtained in ESD protection devices wherein the first trench diode and the second trench diode comprise a plurality of trenches in parallel. By doing so, the area of the first and the second junction is further increased. The larger the area of the junctions the higher the current-carrying capability of the ESD protection device. The area of the first and second junction is even further increased in very advantageous embodiments where the plurality of trenches in each diode are arranged in an array, the arrays being arranged as an interdigitated comb structure for creating a very large junction area for both the first junction and the second junction.

The invention further relates to a semiconductor device comprising said ESD protection device. In some applications, wherever the technology allows it, it may be advantageous to integrate the ESD protection device into a semiconductor device. This may then save manufacturing costs at the packaging level.

The invention further relates to an arrangement of said ESD protection device connected to a light-emitting diode. A light emitting diode is generally mounted as a die on a ceramic submount. The ESD protection device in accordance with the invention may advantageously be integrated as an additional die on the same ceramic submount.

The invention also relates to an integrated system in a package comprising said ESD protection device. If the ESD protection device can not be integrated into a semiconductor die, the invention advantageously provides for the option of at least integrating the ESD protection device into the same system in a package. Preferably, the ESD protection device is integrated as a separate device mounted in the package. This allows the manufacturer to maximally adapt the technology, used in the separate device, to the "needs" of the ESD protection device, thus obtaining best ESD protection properties.

The invention also provides a semiconductor device comprising a first contact and a second contact, a first array of trench diodes and a second array of trench diodes, wherein the first and the second array of trench diodes are arranged in anti-series between the first contact and the second contact. The provision of trench diodes extending into the substrate allows a substantial increase in the junction area of the diode. By providing a first and a second array of trench diodes, instead of single diodes, it is achieved that the trench diodes have a lateral extension in the substrate. This enables that the first and the second array can be positioned opposite to each other, so as to create an anti-series arrangement. Such an anti-series arrangement is particularly suitable for use as an ESD-protection, although alternative applications are by no means excluded.

It is acknowledged that WO-A 2005/117133 discloses a trench diode for use as an ESD-protection. However, that document does not show an anti-series arrangement of a first and second trench diode. Instead, the diode is used for the connection of substrate zones extending laterally through the substrate. It is observed herein, that the mere provision of a single and a second trench diode would not lead to desired results; the junctions of the trench diodes would be facing away from each other for a very large part, and hence, the anti-series arrangement would be accompanied by parasitic single diodes or other unforeseen artifacts.

It is observed that the array of trench diodes may be merged into a single diode with a substantial lateral extension. This may be achieved by the provision of slits instead of cylindrical trenches. It may alternatively be achieved with an embodiment in which the junction of the diode is located outside the trench in the substrate between a first and a second region. When the trenches are defined sufficiently near to each other, the first substrate region will be continuous, so that there is effectively a single junction. This however limits the actual surface area of the junction, and is believed not to be optimal. The diodes are suitably designed as Zener diodes, although other diodes are by no means excluded.

In a suitable embodiment, the trench diodes comprise a first region of a first conductivity type at a sidewall of the trench and a second region of a second opposite conductivity type adjacent to the first region away from the trench. This embodiment allows that the second regions of the first and second arrays of trench diodes are formed by one a single region. In this embodiment, the size of this second region may be tuned so as to create a bipolar transistor, as described above. While the provision of such bipolar transistor in addition to the anti-series arrangement of the trench diodes is considered to give optimal performance, this bipolar transistor is not strictly necessary for all applications. Particularly, the ESD protection will already benefit from the structure with the said first and second array of trench diodes, for instance to create a back-to-back diode with an gigantic junction area within a small substrate area of the substrate.

As explained above, one advantage of this embodiment is the provision of trench capacitors in series with the trench diodes. The trench capacitors are then defined between the contact and the first region of the diodes. Such trench capacitors may be applied for filtering purposes, without hampering the ESD-performance of the trench diodes. Effectively, therefore, the capacitors can be defined as well, when no filter performance is desired.

A further advantage of such embodiment is that trench capacitors may further be defined in an area of the substrate remote from the present arrays of trench diodes. Such trench capacitors can be made within the same process flow, without the need of temporarily covering the trenches. These capacitors will be functionally independent, and may be used, for example, as decoupling capacitors for RF applications, or as part of DC-DC converters.

In a further embodiment, the first and second array of trench diodes are extended into a interdigitated comb structure. Such structure is considered an optimal embodiment with respect to size and performance.

As will be understood from the following figures and the foregoing description, the present array structure is most suitably part of a submount. Such submount is intended for use as a carrier of further semiconductor devices, such as light emitting diodes and/or integrated circuits. In order to couple the signals of the submount to an external component, such as a printed circuit board, use can be made of several assembly techniques. One example constitutes the class of a leadframe packages with either solder balls or wirebonds between the submount and the leads of the leadframe. A laminate carrier could be used alternatively, but is considered disadvantageous from both a thermal cycling and a cost perspective. Another example constitutes the class of chip scale package in which the submount is coupled to the external component directly, e.g. without leadframe or alternative carrier but with solder balls. Specifically suitable for advanced packaging is the provision of through-hole vias. Such vias may be used for RF grounding and/or for signal transmission. As part of such advanced packaging the substrate may be thinned to thicknesses below 100 microns, or even to a thickness such that the trenches will be exposed. In such version, there is a need to apply an overmoulding or other protection on top of the submount in advance of the thinning, in order to maintain mechanical integrity.

Nonetheless, the present array structure, and the present combination of diodes and bipolar transistor according to the second and the first aspect of the invention, may also be used otherwise, either as discrete devices or as part of (CMOS) integrated circuits.

These and other aspects of the invention are apparent from and will be elucidated with reference to the embodiments described hereinafter.

DETAILED DESCRIPTION OF THE PREFERRED EMBODIMENT

It should be noted that the above-mentioned embodiments illustrate rather than limit the invention, and that those skilled in the art will be able to design many alternative embodiments without departing from the scope of the appended claims. In the claims, any reference signs placed between parentheses shall not be construed as limiting the claim. Use of the verb "comprise" and its conjugations does not exclude the presence of elements or steps other than those stated in a claim. The article "a" or "an" preceding an element does not exclude the presence of a plurality of such elements. The invention may be implemented by means of hardware comprising several distinct elements, and by means of a suitably programmed computer. In the device claim enumerating several means, several of these means may be embodied by one and the same item of hardware. The mere fact that certain measures are recited in mutually different dependent claims does not indicate that a combination of these measures cannot be used to advantage.

System level ESD protection is becoming a very big challenge for various applications. There is a strongly increasing need for high level ESD protection, preferably level 4 and higher.

Figure 1:
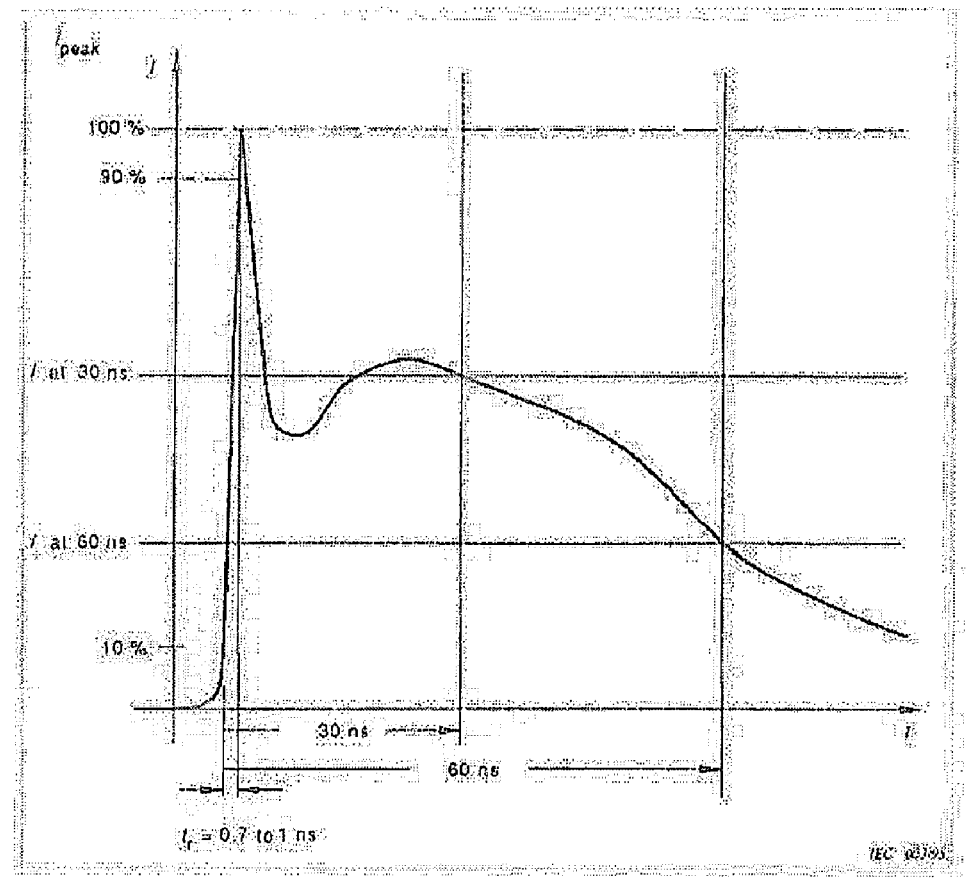
FIG. 1 shows a plot of a typical current waveform as a function of time during an ESD event simulated with an IEC61000-4-2 Gun test system.

FIG. 1 shows a plot of a typical current waveform as a function of time during an ESD event simulated with an IEC61000-4-2 Gun test system. Table 1 shows the requirements for the ESD protection level. As illustrated in Table 1, a higher ESD protection level means a tolerance for larger ESD peak currents (up to 30 A in level 4).

TABLE 1

ESD protection level requirements

| Level | Indicated voltage (kV) | First peak current of discharge ± 10% (A) | Rise time $t_r$ with discharge switch (ns) | Current (±30%) at 30 ns (A) | Current (±30%) at 60 ns (A) |
|---|---|---|---|---|---|
| 1 | 2 | 7.5 | 0.7 to 1 | 4 | 2 |
| 2 | 4 | 15 | 0.7 to 1 | 8 | 4 |
| 3 | 6 | 22.5 | 0.7 to 1 | 12 | 6 |
| 4 | 8 | 30 | 0.7 to 1 | 16 | 8 |

As illustrated in FIG. 1, the first ESD peak current has a short duration and the value of the current is large. Therefore, an ESD protection device, in order to be efficient, has to be very robust, very fast and should be able to provide a very low clamping voltage. ESD protection devices implemented in CMOS technology are usually unable to comply with all these requirements. Until now, when ESD protection devices have to be integrated with CMOS circuits in a system, it was common practise to integrate the ESD protection device as a separate die manufactured in an technology adapted for the ESD requirements. In today's systems even multiple dies are added for protecting the various different IC's integrated therein. For instance, in a typical Nokia phone there may be up to 9 ESD protection circuits.

In the prior art, there is a trend visible towards integration of complete systems into a single package (SIP). The ESD protection device according to the invention enables integration into the same SIP as will be discussed later.

Figure 2:
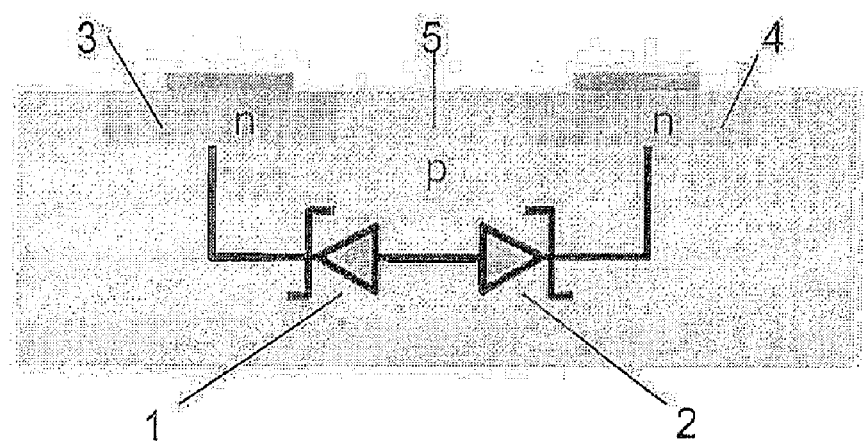
FIG. 2 shows an ESD protection device as known from the prior art.

FIG. 2 shows an ESD protection device as known from the prior art. The ESD protection device comprises two Zener-diodes 1, 2 arranged in anti-series. The Zener-diodes are formed by implementing semiconductor regions 3, 4 of a first conductivity type, for example n-type semiconductor regions, into a semiconductor body 5 of a second opposite conductivity type, for example a p-type semiconductor substrate. The first Zener-diode 1 is formed by the junction between the substrate 5 and the first semiconductor region 1 and the second Zener-diode 2 is formed by the junction between the substrate 5 and the second semiconductor region 2. Arranging the Zener-diodes in anti-series (in a back-to-back configuration) as in FIG. 2 results in a device, which always has one diode biased in forward direction and one diode biased in backward direction.

Zener-diodes typically operate in their reverse-bias region when used as an ESD protection device. The advantage of using Zener-diodes is that the Zener breakdown voltage is relatively high. This enables the skilled person to use the ESD protection device for protecting circuit nodes having a relatively high voltage swing in normal operation. The designer may freely choose the right substrate resistivity to tune the reverse voltage needed. The resistivity of the substrate 5 can be tuned by, for example, choosing a different doping level of the substrate.

Figure 3:
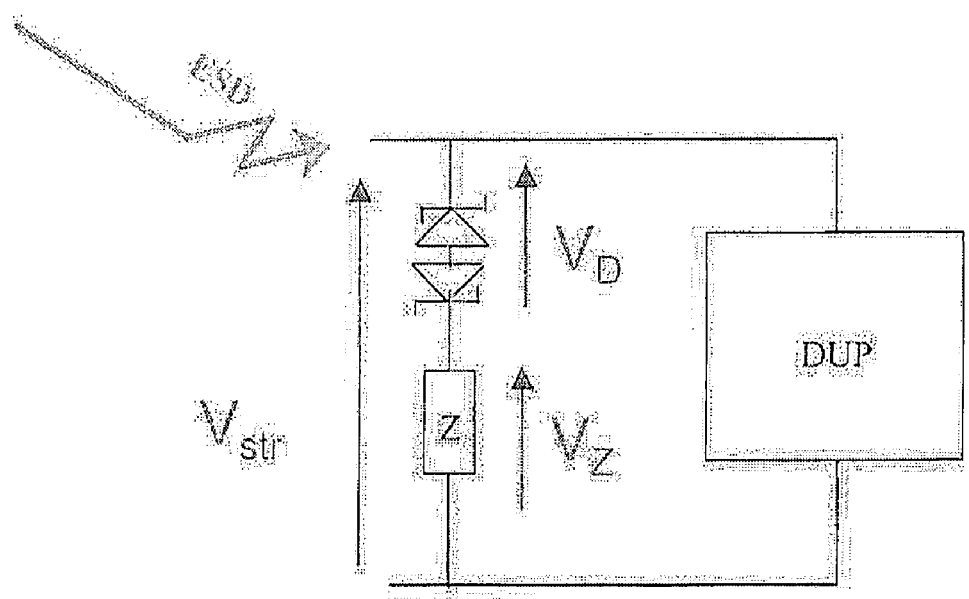
FIG. 3 shows a simplified electrical schematic of the ESD protection device of FIG. 2 when used to protect an electrical device.
Figure 4:
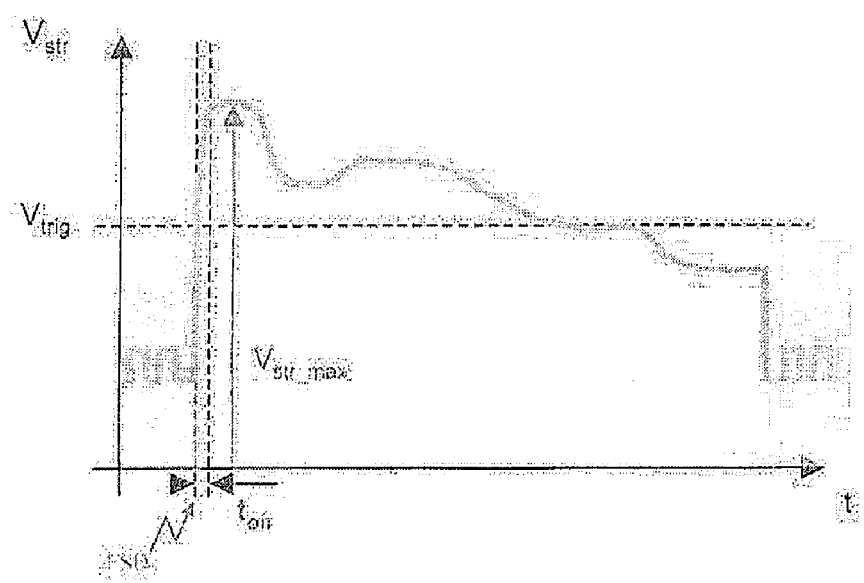
FIG. 4 shows a typical transient voltage response of the ESD protection device of FIG. 2.

FIG. 3 shows a simplified electrical schematic of the ESD protection device of FIG. 2 when used to protect an electrical device. FIG. 4 shows a typical transient voltage response (as a function of time t) of the ESD protection device of FIG. 2. The ESD protection device has a parasitic impedance Z. Generally, this parasitic impedance is mainly resistive. In that case the resistance of this structure comes mainly from (p-type) substrate, because the n-type semiconductor regions are generally highly doped and therefore their parasitic resistance is negligible.

The maximum clamping voltage $V_{str,max}$ of the ESD protection device depends on some key parameters:

The current level of the first ESD peak;

The triggering delay ($t_{on}$) of the protection diodes; and

The parasitic impedance Z of the protection component.

During ESD stress, the clamping voltage $V_{str}$ must not reach the breakdown voltage of the device under protection DUP. The faster the ESD protection device switches on (in other words, the shorter the triggering delay $t_{on}$) the lower is the resulting clamping voltage $V_D$ of the diodes, and thus the lower is the maximum clamping voltage $V_{str,max}$ of the ESD protection device. Also, the parasitic impedance of the ESD protection device is reduced if the triggering delay $t_{on}$, is reduced.

Figure 5:
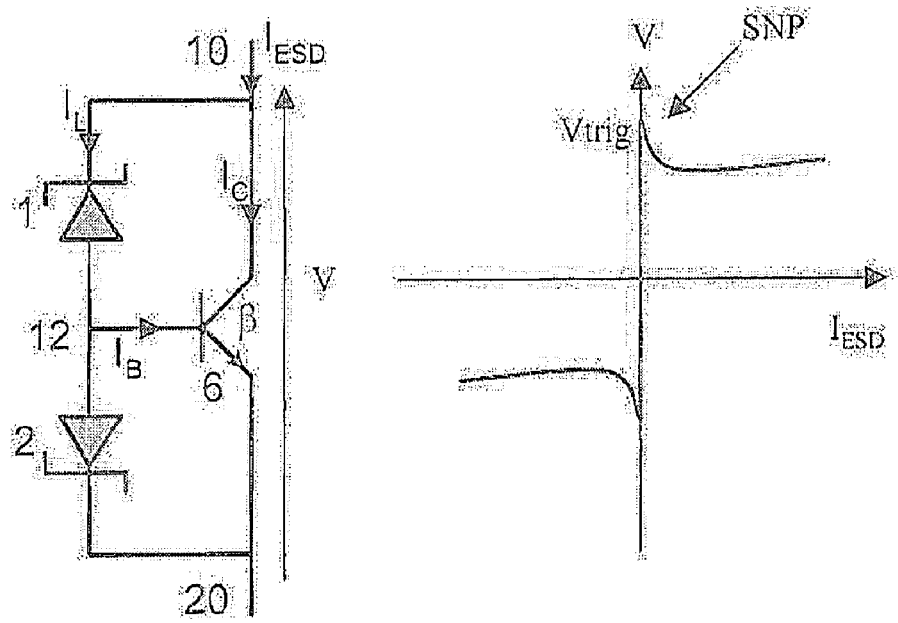
FIG. 5 shows an electrical schematic and a voltage versus current curve of the ESD protection device according to the invention.

FIG. 5 shows an electrical schematic and a voltage versus current curve of the ESD protection device according to the invention. The ESD protection device now also comprises a bipolar transistor 6 connected between a first contact 10 and a second contact 20 (with its collector node and emitter node) in parallel with the anti-series connection of the Zener-diodes 1, 2. The base of the transistor 6 is connected with an electrical node 12 between the diodes 1, 2.

The invention is based upon the discovery of the operation of this circuit when it is properly designed. The operation of this ESD device is especially very interesting in case of an ESD event. When used for protecting an electronic device for ESD events, the ESD protection device is connected with its first contact 10 and its second contact 20, to the nodes of the device under protection. During normal operation of the device under protection, the voltage V between the first contact 10 and the second contact 20 is under a trigger voltage Vtrig of the diode anti-series connection. This results in a high impedance of the ESD device and the ESD device does not disturb the operation of the device under protection. Still an extremely small leakage current $I_L$ will run through the diodes. During an ESD event, the voltage between the first contact 10 and second contact 20 increases above a trigger level $V_{trig}$ of the diodes anti-series connection and the leakage current $I_L$ rapidly increases. The bipolar transistor 6 is designed with such a current gain β that as soon as the leakage current $I_L$ increases above a trigger level $V_{trig}$ the bipolar transistor 6 switches on and its impedance decreases rapidly. As a result, most of the ESD current $I_{ESD}$ will run as a collector current $I_c$ through the bipolar transistor 6. A striking observation is that the impedance of the bipolar transistor decreases so rapidly, that the voltage V reduces to a level even below the trigger level $V_{trig}$ and will hardly increase even if the ESD current $I_{ESD}$ increases even further. As a result, the clamping voltage is very low due this effect, which is now also being referred to as the "voltage snapback effect" SNP. The trigger level $V_{trig}$ corresponds to the breakdown voltage of the diode anti series connection.

Figure 6:
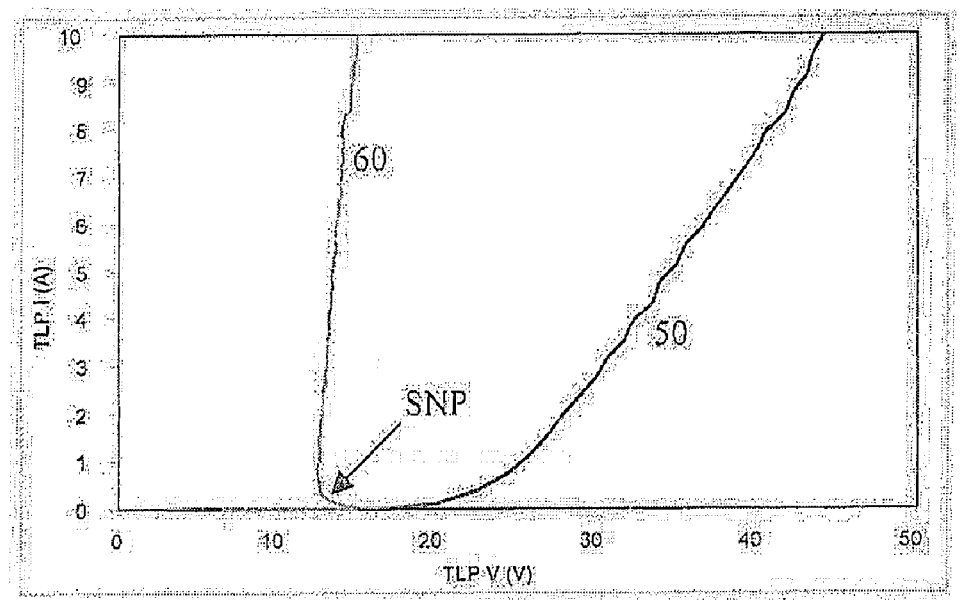
FIG. 6 shows a TLP current-voltage curve of the ESD protection device according to the invention compared with the ESD protection device from the prior art.

FIG. 6 shows a TLP current-voltage curve of the ESD protection device according to an embodiment of the invention compared with the ESD protection device from the prior art. The response of the ESD protection device in FIG. 5 has been compared with a typical Zener-diode configuration as disclosed in FIG. 2. The comparison was done by using a Transmission Line Pulse system. This system creates current-voltage curves in ESD mode. The current-voltage curve 50 of the typical Zener-diode configuration shows a clamping voltage of 44 Volt, whereas the current-voltage curve 60 of the ESD protection device according to the invention shows a clamping voltage of only 15 Volts. This is due to both the snapback effect as well as the very low parasitic impedance of the bipolar transistor in its "On"-state. The ESD protection device according to the invention has a very fast response due to its triggering mode which is based on avalanche behavior. With the combination of fast triggering and low impedance a strong reduction of the peak voltage during an ESD event is obtained.

Figure 7:
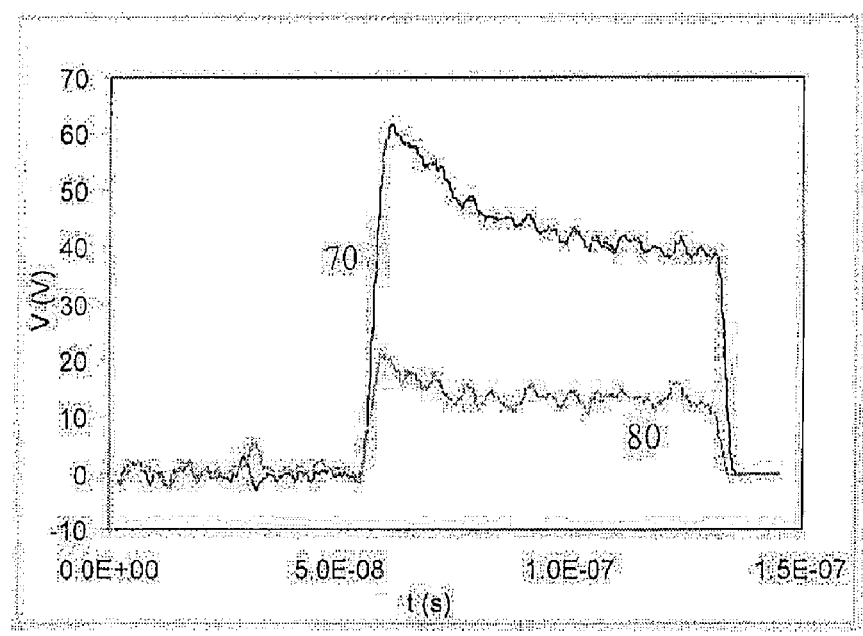
FIG. 7 shows a TLP voltage waveform of the ESD protection device according to the invention compared with the ESD protection device from the prior art.

FIG. 7 shows a TLP voltage waveform of the ESD protection device according to the invention compared with the ESD protection device from the prior art. The voltage waveform 70 of the typical Zener-diode shows a maximum voltage of 60 Volt with a clamping voltage of 40 Volt. On the other hand, the voltage waveform 80 of the ESD protection device according to an embodiment of the invention shows a maximum voltage of 20 Volts with a clamping voltage of 15 Volt.

The ESD protection device according to the invention thus comprises a bipolar transistor, which may be added as an additional component. The advantage of such an embodiment is that the transistor and the diodes can be designed independently.

In a very advantageous embodiment of the invention a parasitic bipolar transistor which is already present in an anti-series connection of diodes is exploited for arranging a voltage-snapback effect. The invention relies upon the insight that the voltage-snapback may be achieved by properly dimensioning the diodes and their mutual position and orientation. By doing so the parasitic bipolar transistor which is inherently present may be tuned to play a more dominant role.

In case the diode anti-series connection is implemented by means of semiconductor regions D1, D2 in a semiconductor body 5 as illustrated in FIG. 2 the distance between the two semiconductor regions D1, D2, which may for example be N-diffusion regions, may be reduced. By doing so not only the parasitic resistor in the diode anti-series connection is reduced. Also a base length of a parasitic bipolar transistor composed by the two diffusion regions (the collector and the emitter) and the p substrate (the base) is reduced. By decreasing the base length, this parasitic bipolar transistor becomes more efficient, which means that the current gain β increases. The more the distance between the diffusion regions is reduced the more dominantly will the transistor behaviour be present. Additionally or alternatively, the doping level in the substrate (the base) can be decreased in order to (further) increase the current gain β. These two parameters may be used by a designer to obtain the desired voltage-snapback effect, which will occur at a minimum value of the current gain. The real value of this minimum current gain depends on technology specific parameters. However, knowing the technology specific parameter, the skilled person may obtain the voltage-snapback effect with just a few trials. The inventors have discovered that with a substrate doping level of $1.10 \exp 17$ atoms/cm$^3$ (boron), a snapback effect was observed for bases lengths shorter than 50 μm. The diode breakdown voltage (or Zener voltage, or trigger voltage) was around 17V. The substrate (base) doping level also determines the trigger voltage of the diodes.

Another important property of an ESD protection device is the maximum allowable current which may run through it. This current tolerance is also being referred to as the robustness of the ESD protection device. One way of increasing the robustness of the ESD protection device is to increase the effective base area of the parasitic bipolar transistor. The channel area is defined as the effective cross-sectional area of the base perpendicular to the current-flow direction through the base. In case of an ESD protection device as illustrated above the effective base area is determined by the dimensions of the semiconductor regions D1, D2 perpendicular to the current-flow direction through the base. Practically, these dimensions are increased by making the semiconductor regions deeper and wider. Making the semiconductor wider may not be an attractive option, because of the reduced packing density.

Figure 8:
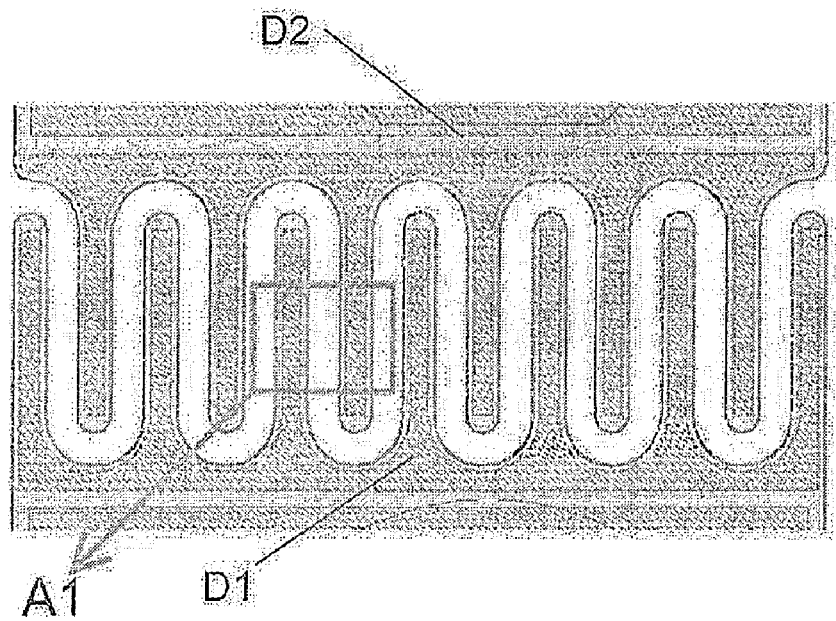
FIG. 8 shows a top view of an ESD protection device having an interdigitated comb structure according to an embodiment of the invention.
Figure 9:
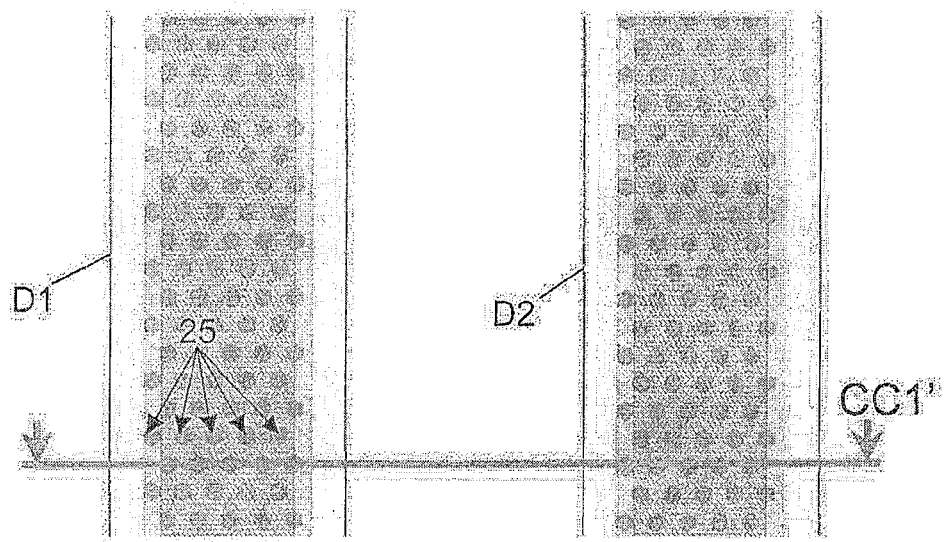
FIG. 9 shows an enlarged view of part A1 of the ESD protection device of FIG. 8.
Figure 10:
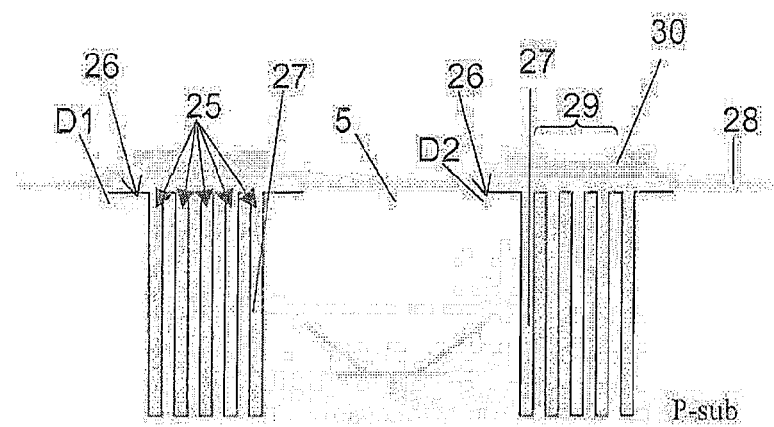
FIG. 10 shows cross-sectional view CC1' of the same part A1 of the ESD protection device of FIG. 8.

However, a very advantageous embodiment of the ESD protection device is obtained if the junctions of the diode are provided as very deep diffusions so as to form trench diodes. Yet, an even more advantageous embodiment is obtained if the semiconductor regions are provided as an interdigitated comb structure, which increases the junction area even further. This very advantageous embodiment is illustrated in FIGS. 8 to 10. FIG. 8 shows a top view of an ESD protection device having an interdigitated comb structure according to an embodiment of the invention. FIG. 9 shows an enlarged view of part A1 of the ESD protection device of FIG. 8. FIG. 10 shows cross-sectional view CC1' of the same part A1 of the ESD protection device of FIG. 8. In this example the diodes are formed by semiconductor regions (diffusion regions) of a first conductivity type D1, D2 adjacent to sidewalls of deep trenches 25 in a substrate 5 of a second opposite conductivity type. The trenches are preferably deeper than 10 μm, and even more preferably deeper than 20 μm. The formation of trenches 25 can be done, for example, by means of etching. These processing techniques are well known to a person skilled in the art. The semiconductor regions D1, D2 of the first conductivity type can be formed by means of diffusion techniques, which are well-known to the person skilled in the art.

The number of trenches 25 to be formed is up to the designer's choice. It can be one trench per diode, but also any other number. The larger the number of trenches 25, the larger the junction area of the diodes, and the larger the effective base area of the parasitic bipolar transistor. The result of creating deep trench diffusion regions is a bipolar transistor which is very robust. More robust means that (it may carry a much larger current without getting damaged. The interdigitated comb structure as illustrated in FIG. 8 even further increases the robustness. No change in the voltage-snapback effect (trigger voltage) was observed for these 3D-enhanced diode structures, as base length and the substrate doping was kept the same as mentioned earlier in this description.

In order to create a functioning device, the diffusion regions D1, D2 need to be contacted and connected to the contacts of the ESD protection device. The diffusion regions D1, D2 may be contacted by means of known interconnecting techniques at other locations not shown in FIGS. 8 to 10.

The structure as illustrated in FIGS. 8 to 10 provides another advantage. High-density capacitors may be integrated into the trenches 25. This may for example be done by depositing a dielectric layer 26, for example silicon nitride, on the n-type diffusion regions D1, D2. Thereafter a conductive layer 27, for example polysilicon, may be provided on the dielectric layer 26. In this way a capacitor is formed between the conductive layer and the n-type diffusion region. This capacitor may advantageously be used for certain applications, for example, decoupling the ESD pulse as will be discussed later.

The ESD protection device may be provided with a further dielectric layer 28, for example silicon dioxide, covering the device, whereafter contact holes 29 are made in the further dielectric layer 28 and metallization 30 is provided to connect to the polysilicon of the capacitor.

The ESD protection device may be provided with a capacitor on each side or just on one side. Alternatively, multiple capacitors may be arranged on one side. In that case the poly silicon should be disconnected at some point so as to create more than one capacitor in the plurality of trenches 25.

Instead of creating diffusion regions D1, D2 at sidewalls of a trench 25 by means of implantation, an alternative structure may be one wherein the trenches 25 are filled with a semiconductor material of an opposite conductivity type then the substrate 5. However, in that case the capacitors can no longer be implemented in the trenches. Still, the resulting structure is less complex, which may be an advantage in certain applications.

The technology as illustrated in FIGS. 8 to 10 greatly resembles the PICS process as available within NXP semiconductors. As discussed already earlier, in this process, the capacitor may be formed without any additional process steps. An ESD protection device comprising a large capacitor is especially suitable for low-frequency applications. At low frequencies the impedance of the capacitor is very large thus the ESD protection then hardly influences the device under protection. The integration of the capacitor into the PICS process also enables the designer to integrate the ESD protection device into a system-in-a-package (SIP), because the PICS process was already used for creating passive components which are needed in SIP. The use of this 3D PICS capability realises a very robust, fast and efficient ESD protection device.

Figure 11:
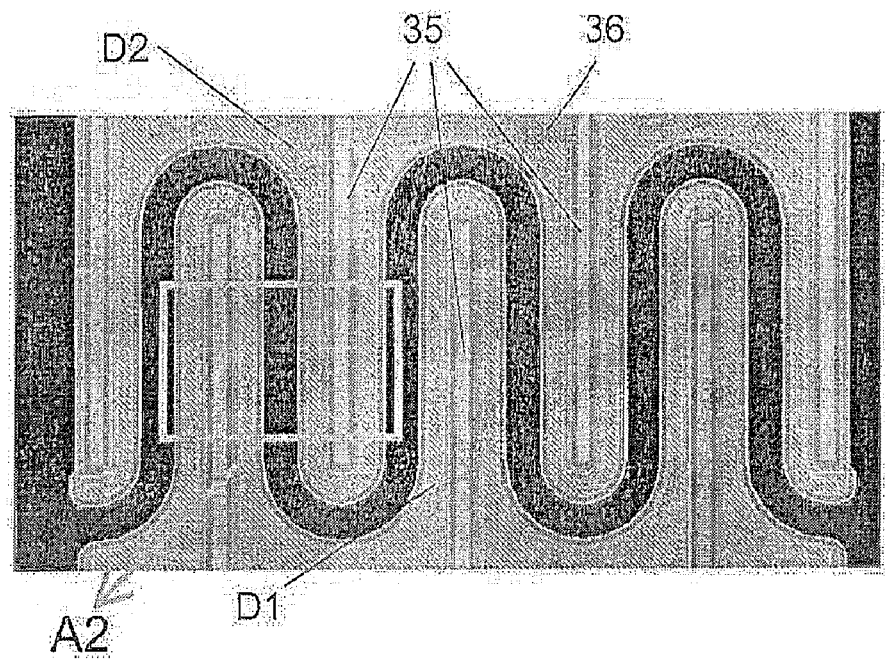
FIG. 11 shows a top view of an ESD protection device having an interdigitated comb structure according to another embodiment of the invention.
Figure 12:
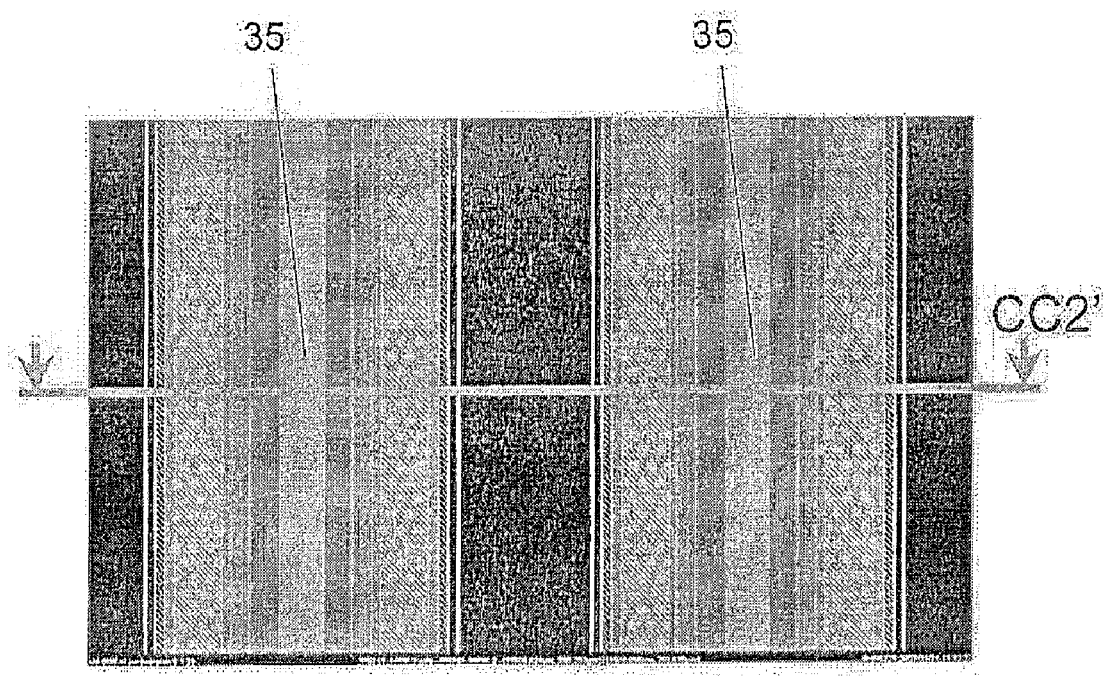
FIG. 12 shows an enlarged view A2 of part of the ESD protection device of FIG. 11.
Figure 13:
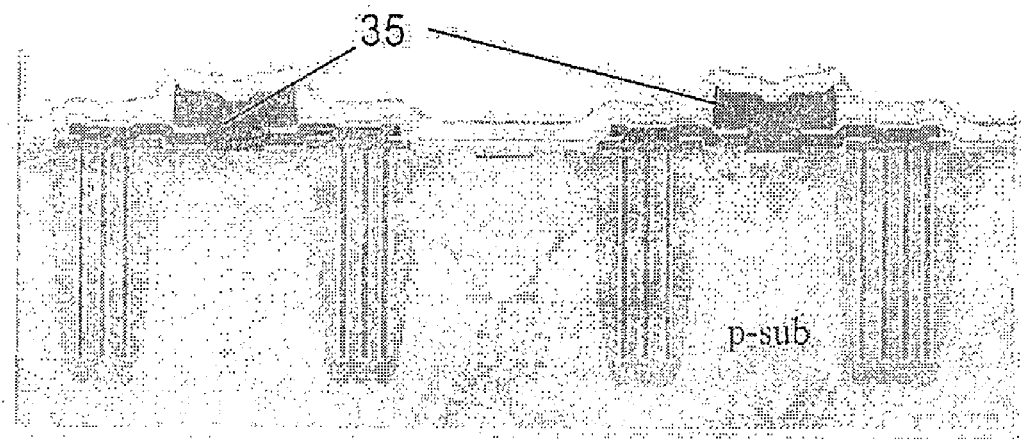
FIG. 13 shows cross-sectional view CC2' of the same part A2 of the ESD protection device of FIG. 11.

FIGS. 11 to 13 illustrate an improved embodiment of the ESD protection device of FIGS. 8 to 10. FIG. 11 shows a top view of an ESD protection device having an interdigitated comb structure according to another embodiment of the invention. FIG. 12 shows an enlarged view of part A2 of the ESD protection device of FIG. 11. FIG. 13 shows cross-sectional view CC2' of the same part A2 of the ESD protection device of FIG. 11. The main difference with the embodiment as illustrated in FIGS. 8 to 10 is that an additional metallization layer 35 is put on top of the comb structures. The comb structures have fingers which may have a resistance which is too high for proper functioning of the device, especially when the distance between the N-diffusion areas is very small (and the transistor is very efficient).

In that case the resistance of the fingers of the comb structure may be reduced by the additional metallization layer 35, which preferably has a low resistance, and which is effectively connected in parallel with the polysilicon 27 and/or metal layer 30 of the fingers. The independent metallization lines 35 may be connected together with a further additional metallization line 36.

These FIGS. 11 to 13 further illustrate effectively the second aspect of the invention. FIG. 11 shows in cross-sectional view the structure with a first array of trench diodes, and a second array of trench diodes. The first and the second array of trench diodes are arranged in anti-series between the first contact and the second contact. The junctions of the diodes are present between a first and a second region of opposite conductivity, both of which are defined in the semiconductor substrate. The first region is here defined at a sidewall of the trench. As will be recognized, the junctions of at least some of the individual diodes in an array are fused into a single junction. This is however not necessary and may be an artifact of the diagrammatical drawing. FIGS. 12 and 13 illustrate a preferred embodiment of this aspect of the invention, being a structure in which the contact extend as longitudinal, line-shaped contacts. It will be understood that this improves the back-to-back arrangement of the diode arrays. More specifically, a comb structure with interdigitated fingers is shown. Such comb structure comprises at least three fingers, and more suitably five, seven (as shown in FIG. 12) or even more fingers. While it is optimal to design the structure so as to include a bipolar transistor according to the first aspect of the invention, this is not deemed necessary for all applications or all possible embodiments of this second aspect of the invention.

Figure 14:
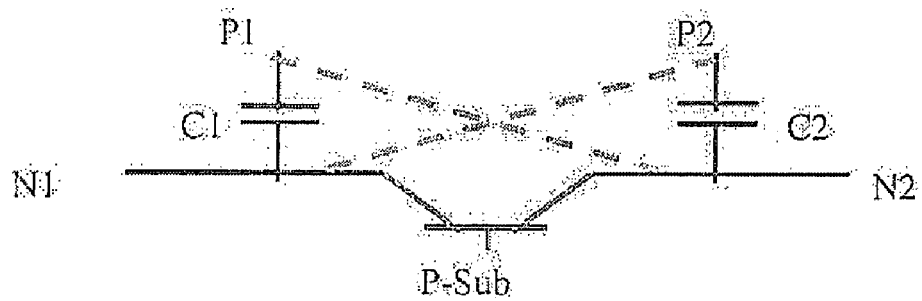
FIG. 14 shows a first schematical arrangement of the capacitors in FIG. 10.
Figure 15:
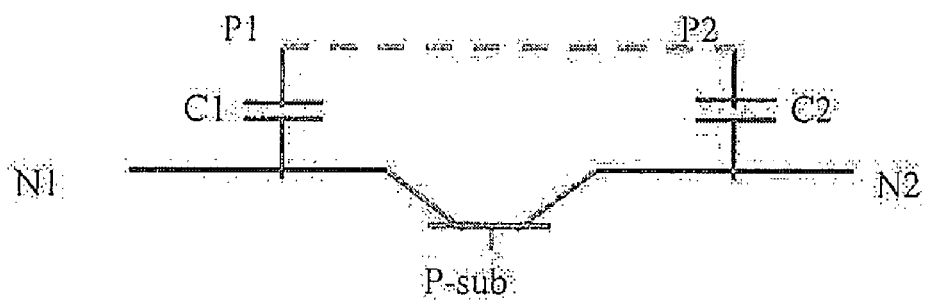
FIG. 15 shows a second schematical arrangement of the capacitors in FIG. 10.

FIG. 14 and FIG. 15 show a first and a second schematical arrangement of the capacitors in FIG. 10. In FIG. 14 the capacitors C1, C2 both have been connected in parallel with the bipolar transistor. The total capacitance connected in parallel with the transistor is then increased. This embodiment provides for maximal decoupling performance. In the arrangement in FIG. 15 the capacitors are connected in series, the series connection being connected in parallel with the bipolar transistor. This embodiment provides less decoupling performance as the total capacitance connected in parallel with the transistor is reduced. However, an advantage of this arrangement is that the series connection of the two capacitors provides for a higher breakdown voltage.

The invention thus provides, in a first aspect, an ESD protection device having a reduced clamping voltage by implementing an additional bipolar transistor in parallel with a diode anti-series arrangement. In some embodiments the junction areas are increased in order to have a higher robustness (higher allowable current). In all embodiments of this aspect it is important that the bipolar transistor is designed with such a current gain that a voltage snap-back effect is observed in the voltage-current characteristic of the ESD protection device. The invention of this first aspect further relies on the insight that a bipolar transistor which is inherently present in every diode anti-series arrangement may be exploited for acting as the bipolar transistor. This is possible by properly dimensioning the ESD protection device.

According to the second aspect of the invention, the semiconductor device comprises a first and a second array of trench diodes coupled in an anti-series arrangement between a first and a second contact. In this aspect, it is relevant that the arrays of the trench diodes have a certain lateral extension, so as to improve the anti-series arrangement.

Various variations of the ESD protection device in accordance with the invention are possible. In the embodiment of FIG. 5 Zener-diodes 1, 2 are used. The use of Zener diodes is not mandatory. Also avalanche diodes may be used. However, the disadvantage of avalanche diodes is that they are used to clamp voltage in their forward direction, which means that the clamping voltage is very small.

Also, throughout the description of the preferred embodiments conductivity types may be reversed. In the case of the embodiment of FIG. 5, the diodes share their fronts, and the parasitic bipolar transistor is then a pnp transistor. In that embodiment also the diodes are arranged in anti series, wherein one diode is reverse-biased while the other is forward biased. The principle of operation stays the same.

The invention claimed is:

1. An ESD protection device comprising:
    a first contact and a second contact, and an electrical node;
    a bipolar transistor having a base, an emitter, and a collector, the base and emitter forming a base-emitter junction, the base and collector forming a base-collector junction, the emitter being connected to the first contact, the collector being connected to the second contact, the base being connect to the electrical node;
    a first diode connected between the electrical node and the first contact, the first diode comprising a first junction arranged in the same direction as the base-emitter junction, and
    a second diode connected between the electrical node and the second contact, in anti-series with the first diode on a path from the first contact to the second contact, the second diode comprising a second junction arranged in the same direction as the base-collector junction,
    wherein the bipolar transistor is dimensioned to have such a current gain that the voltage-current characteristic of the ESD protection device, measured between the first and second contact, exhibits a voltage snap-back effect at its trigger voltage.

2. The ESD protection device as claimed in claim 1, wherein the first diode and the second diode are Zener-diodes.

3. The ESD protection device as claimed in claim 1, wherein the first junction, the second junction, the base-emitter junction, and the base -collector junction are formed by semiconductor regions of a first conductivity type in a semiconductor body of a second opposite conductivity type.

4. The ESD protection device as claimed in claim 1, wherein the base-emitter junction is formed by the first junction and the base-collector junction is formed by the second junction, so as to use a parasitic bipolar transistor already present formed by the first junction and the second junction of the diodes.

5. The ESD protection device as claimed in claim 4, wherein the gain of the bipolar transistor is determined by the distance between the first junction and the second junction.

6. The ESD protection device as claimed in claim 4, wherein the gain of the bipolar transistor is determined by doping levels of the semiconductor body.

7. The ESD protection device as claimed in claim 3, wherein the first junction is formed as a first trench diode.

8. The ESD protection device as claimed in claim 7, wherein the second junction is formed as a second trench diode.

9. The ESD protection device as claimed in claim 8, wherein the trench diodes comprise a first region of a first conductivity type at a sidewall of the trench and a second region of a second opposite conductivity type adjacent to the first region away from the trench.

10. The ESD protection device as claimed in claim 9, wherein the trench of the first trench diode comprises a dielectric layer provided on all sidewalls of the trench and a conductive layer provided on the dielectric layer for forming a capacitor between the conductive layer and the first region of the first trench diode.

11. The ESD protection device as claimed in claim 10, wherein the conductive layer of the capacitor is electrically connected to the first region of the second trench diode so as to be connected in parallel to the bipolar transistor.

12. The ESD protection device as claimed in claim 11, wherein the trench of the second trench diode comprises a further dielectric layer provided on all sidewalls of the trench and a further conductive layer provided on the further dielectric layer for forming a further capacitor between the further conductive layer and the first region of the second trench diode.

13. The ESD protection device as claimed in claim 12, wherein the further conductive layer of the further capacitor is electrically connected to the first region of the first trench diode so as to be connected in parallel to the bipolar transistor.

14. The ESD protection device as claimed in claim 10, wherein the trench of the second trench diode comprises a further dielectric layer provided on all sidewalls of the trench and a further conductive layer provided on the further dielectric layer for forming a further capacitor between the further conductive layer and the first region of the second trench diode, the capacitor and the further capacitor being connected in series with each other and in parallel with the bipolar transistor.

15. The ESD protection device as claimed in claim 8, wherein the first trench diode and the second trench diode are formed by a trench filled with material of a first conductivity type, and material adjacent the trench of a second opposite conductivity type.

16. The ESD protection device as claimed in claim 8, wherein the first trench diode and the second trench diode comprise a plurality of trenches in parallel.

17. The ESD protection device as claimed in claim 16, wherein the plurality of trenches in each diode are arranged in an array, the arrays being arranged as an interdigitated comb structure for creating a very large junction area for both the first junction and the second junction.

18. A Semiconductor device comprising the ESD protection device as claimed in claim 1.

19. An integrated system in a package comprising a monolithic semiconductor device with an ESD protection device integrated therein, the ESD protection device including, a first contact and a second contact, and an electrical node:

a bipolar transistor having a base, an emitter, and a collector, the base and emitter forming a base-emitter junction, the base and collector forming a base-collector junction, the emitter being connected to the first contact, the collector being connected to the second contact, the base being connect to the electrical node:

a first diode connected between the electrical node and the first contact, the first diode comprising a first junction arranged in the same direction as the base-emitter junction, and a second diode connected between the electrical node and the second contact, in anti-series with the first diode on a path from the first contact to the second contact, the second diode comprising a second junction arranged in the same direction as the base-collector junction, wherein the bipolar transistor is dimensioned to have such a current gain that the voltage-current characteristic of the ESD protection device, measured between the first and second contact, exhibits a voltage snap-back effect at its trigger voltage.

20. Integrated system as claimed in claim 19, wherein the ESD protection device is integrated as a device mounted in the package separate from the monolithic semiconductor device.

* * * * *